United States Patent [19]

Nutz

[11] Patent Number: 4,962,439
[45] Date of Patent: Oct. 9, 1990

[54] SQUARING CIRCUIT

[75] Inventor: Karl-Diether Nutz, Oedheim, Fed. Rep. of Germany

[73] Assignee: Telefunken electronic GmbH, Heilbronn, Fed. Rep. of Germany

[21] Appl. No.: 301,975

[22] Filed: Jan. 25, 1989

[30] Foreign Application Priority Data

Apr. 21, 1988 [DE] Fed. Rep. of Germany ....... 3813413

[51] Int. Cl.$^5$ .............................................. H04H 3/08
[52] U.S. Cl. ....................................... 361/95; 361/101
[58] Field of Search ..................... 361/93, 94, 95, 100, 361/101; 331/62; 328/15, 144; 363/8

[56] References Cited

U.S. PATENT DOCUMENTS 3,539,931  2/1968  Joure ................................... 328/144
4,246,622  1/1981  Hosoda et al. ......................... 361/95
4,583,004  4/1986  Yearsin .................................. 361/94

FOREIGN PATENT DOCUMENTS 2211827  9/1972  Fed. Rep. of Germany .
3618874 12/1986  Fed. Rep. of Germany .
140521   3/1980  German Democratic Rep. .

Primary Examiner—Derek S. Jennings
Attorney, Agent, or Firm—Spencer & Frank

[57] ABSTRACT

A squaring circuit and an $i^2t$ circuit utilizing the squaring circuit. The squaring circuit comprises a voltage-controlled oscillator and a frequency/current converter which are connected to one another, with the input voltage signal being supplied to the voltage-controlled oscillator and to the frequency/current converter on the one hand, and with the output voltage signal being tappable at an RC network connected to the output of the frequency/current converter on the other hand. The value of the output voltage is proportional to the square of the value of the input voltage. With this squaring circuit, it is possible to construct an $i^2t$ protective circuit for protection of an electrical consumer from overload.

12 Claims, 1 Drawing Sheet

SQUARING CIRCUIT

BACKGROUND OF THE INVENTION

The invention relates to a squaring circuit supplying an output voltage whose value is proportional to the square of the value of the input voltage.

The expression $i^2t$, in which i is the load current of an electrical consumer or load and t the appropriate period of time, permits conclusions to be drawn as to the temperature behaviour of an electrical consumer or load, for example a DC motor. To obtain the square of load current i so-called OTA (operational transconductance amplifier) circuits are usually employed, although they have a drawback in that only signal amplitudes of a few millivolts can be processed.

SUMMARY OF THE INVENTION

The object underlying the invention is to provide a squaring circuit of the type described at the outset that processes input voltage signals with signal amplitudes of up to several volts, for example 5 V.

This object is attained in accordance with the invention by a voltage-controlled oscillator and a frequency/current converter which are connected to one another, where on the one hand the input voltage signal is supplied to the voltage-controlled oscillator and frequency/current converter, and on the other hand the output voltage signal can be tapped at an impedance connected to the output of the frequency/current converter.

In a first advantageous embodiment according to the invention, the impedance comprises an RC network.

In accordance with a further preferred embodiment of the invention, the frequency/current converter works according to the principle of a charge pump.

The squaring circuit in accordance with the invention can be used in an $i^2t$ protective circuit to protect the electrical consumer from overload. In an advantageous embodiment of an $i^2t$ protective circuit of this type, the load current passing a measuring resistor for an electrical consumer to be protected, in order to generate a current-proportional voltage signal, is passed to an amplifier and then to an integrator. This voltage signal is applied to the input of the squaring circuit, the output current signal of the squaring circuit generates at its RC network the output voltage which is then supplied to a comparator, and the operating condition of the electrical consumer is controlled by means of the output signal of the comparator.

In a further advantageous embodiment of an $i^2t$ protective circuit of this type, the output current of the squaring circuit is selected so low that a protective function is ensured even in intermittent operation of the electric consumer by means of the capacitor of the RC network.

BRIEF DESCRIPTION OF THE DRAWINGS

The invention and an embodiment of an $i^2t$ protective circuit will now be described in greater detail, with reference to the drawings, in which.

DESCRIPTION OF THE PREFERRED EMBODIMENTS

Figure 1:
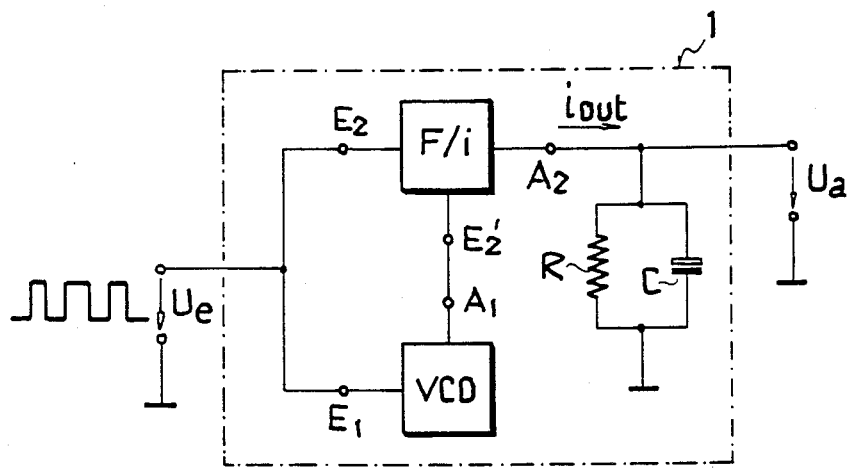
FIG. 1 shows the block diagram of the squaring circuit in accordance with the invention.

The squaring circuit 1 in accordance with FIG. 1 is supplied with the input voltage signal $U_e$, for example a pulse-width-modulated DC voltage signal, via the input $E_1$ to the voltage-controlled oscillator VCO, which converts this signal into a signal with input voltage-proportional frequency and passes this signal via its output $A_1$ to input $E_2$, of the frequency/current converter F/i, to whose second input $E_2$ the input voltage signal $U_e$ is also applied. This frequency/current converter is designed according to the charge pump principle, in that a pump capacitor $C_p$ is reverse-charged with a reverse-charge voltage $U_{cp}$ of an RC network in time with the output frequency f of the voltage-controlled oscillator VCO. The special feature of the converter required here is that the pump capacitor is not subjected to constant voltage, as is usual, but that the voltage is made equal to the input voltage $U_e$ in each case. The output current $i_{out}$ of the frequency/current converter F/i is determined by the exchanging charge and is computed using the following formula:

$$i_{out} = f \cdot C_P \cdot U_{cp}. \quad (1)$$

Since the output frequency f of the voltage-controlled oscillator VCO is proportional to the input voltage $U_e$ and also $U_{cp} = U_e$, the result is a square dependence of the output current $i_{out}$ on the input voltage $U_e$. The output voltage $U_a$ is tapped at an impedance (R, C), preferably an AC network, which is connected by a connector to the output $A_2$ of the frequency/current converter and is earthed with its other connector. In conjunction with formula (1), therefore, the output voltage $U_a$ is:

$$U_a = \overline{i_{out}} R = K_1 \cdot U_e^2 \quad (2)$$

where $\overline{i_{out}}$ is the mean output current and the constant $K_1$ depends on the quantities R, $C_P$ and f. Because of the relationship (2), therefore, the output voltage $U_a$ is proportional to the square of the input voltage $U_e$.

Figure 2:
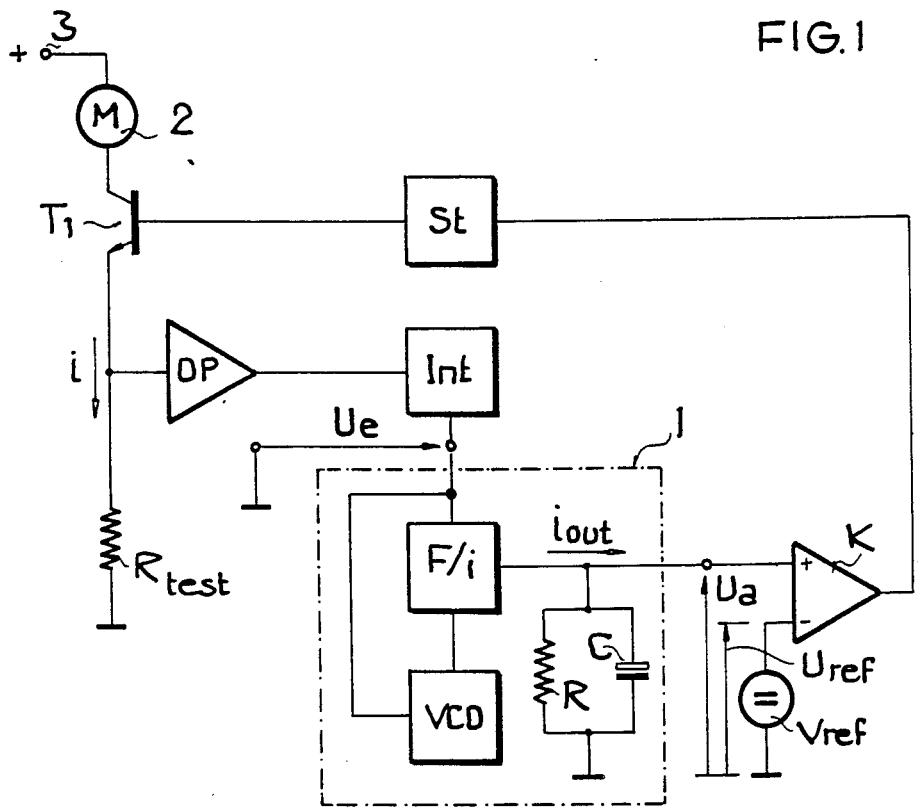
FIG. 2 shows the block diagram of an $i^2t$ protective circuit with the squaring circuit in accordance with FIG. 1.

FIG. 2 shows the use of the squaring circuit 1 in accordance with the invention and with FIG. 1 in an $i^2t$ protective circuit operating as an electronic safety device to protect a DC machine 2 from overload. The DC machine 2 is connected with one connector to a positive operating voltage source 3 and with its other connector to the collector electrode of a control transistor $T_1$ whose emitter electrode is earthed via a measuring resistor $R_{test}$. The load current i flowing in this load current circuit generates a voltage drop at the measuring resistor $R_{test}$ which is picked up at the connection point of the measuring resistor $R_{test}$ and the emitter electrode of the control transistor $T_1$ and passed to an operational amplifier OP for amplification. This signal is integrated in an integrator Int in order to receive at the output of the latter the voltage signal $U_e$ proportional to the load current. This voltage signal $U_e$ is used as the input voltage signal of the squaring circuit 1 according to the invention and connected behind it. The output of the squaring circuit 1 is connected to the non-inverting input of a comparator K while its inverting input is connected to a reference voltage source $V_{ref}$. The output voltage $U_a$ picked up at the RC network (R, C) of the squaring circuit 1 is compared with a threshold voltage $U_{ref}$ using the comparator K. The output of comparator K is connected to a control unit St controlling the base of the control transistor $T_1$.

From the above relationship (2) is obtained, on account of the proportionality of the input voltage $U_e$ to the load current i, the square dependence of the output current $i_{out}$ on the load current i. In addition, the time constant $\tau = RC$ of the RC element formed from resistor R and capacitor C of squaring circuit 1 simulates the time characteristics of the DC machine 2 as regards temperature. The threshold value $U_{ref}$ of the reference voltage source $V_{ref}$ can now be selected so that when the DC machine 2 is overloaded the output voltage $U_2$ exceeds the threshold value $U_{ref}$, and thereby the comparator K controls the control unit St such that the control transistor $T_1$ interrupts the load current circuit and so saves the DC machine 2 from irreparable damage.

During an intermittent operation of the DC machine 2 the $i^2t$ protective circuit would always restart from its starting point with a small time constant $\tau$ of the RC network of the squaring circuit 1, while the DC machine 2 has already stored a certain amount of heat energy. In order to ensure a protective function in this operation too, the output current $i_{out}$ should be selected very low, by selection of the constant $K_1$, in order to store, under high resistance R and acceptable values for the capacitor C, the charge Q proportional to the square of the load current for a certain period. This charge Q represents to a certain extent an equivalent of the stored heat energy in the DC machine 2, with a time constant settable by suitable selection of the quantities for resistor R and capacitor C and simulating the cooling characteristics of the DC machine. This can ensure that the $i^2t$ protective circuit makes some allowance for the current operating temperature of the DC machine 2 during intermittent operation, so that adequate protection of the DC machine 2 from overloading becomes achievable.

What is claimed is:

1. A squaring circuit having a voltage input and supplying an output voltage whose value is proportional to the square of the value of a voltage at said input, comprising:
   a voltage-controlled oscillator and
   a frequency/current converter connected to said voltage controlled oscillator, with the input voltage being supplied to said voltage-controlled oscillator (VCO) and said frequency/current converter and with the output voltage being tappable at an impedance circuit connected to the output of said frequency/current converter.

2. A squaring circuit according to claim 1, wherein the impedance circuit includes an RC network.

3. A squaring circuit according to claim 1, wherein the frequency/current converter is designed as a charge pump.

4. A squaring circuit according to claim 1, wherein said frequency/current converter operates on the principle of a charge pump.

5. A squaring circuit for use in an $i^2t$ protective circuit for protection of an electrical load from overload, said squaring circuit having a voltage input and supplying an output voltage whose value is proportional to the square of the value of a voltage at said input, comprising:
   a voltage-controlled oscillator and a frequency/current converter connected to said voltage controlled oscillator, with the input voltage being supplied to said voltage-controlled oscillator and said frequency/current converter and with the output voltage being tappable at an impedance circuit connected to the output of said frequency/current converter.

6. An $i^2t$ protective circuit for protecting an electrical load drawing a load current, including a squaring circuit having a voltage input and supplying an output voltage whose value is proportional to the square of the value of a voltage at said input, said squaring circuit comprising a voltage-controlled oscillator having an input connected to said voltage input and an output, a frequency/current converter having respective inputs, connected to said voltage input and to the output of said voltage controlled oscillator, and an output for producing an output current signal, and an RC impedance circuit connected to the output of said frequency/current converter, and wherein: the load current from an electrical load to be protected is fed to an amplifier and then to an integrator for generation of a current proportional voltage signal, said voltage signal is applied to the input of said squaring circuit, the output current signal of said squaring circuit generates an output voltage at said RC impedance circuit, said output voltage is then passed to a comparator which generates an output signal, and the operating condition of said electrical load is controlled by the output signal of said comparator.

7. An $i^2t$ protective circuit according to claim 6, wherein the output current of the squaring circuit is selected so low that a protective function is ensured in intermittent operation of the electric load.

8. A squaring circuit for supplying an output voltage having an amplitude proportional to the square of the amplitude of an input voltage fed to said squaring circuit, comprising:
   a voltage-controlled oscillator having an input coupled to the input voltage and an output for producing an output signal having a voltage controlled frequency;
   a frequency/current converter having a first input coupled to the input voltage, a second input connected to the output of said voltage-controlled oscillator, and an output for producing an output current; and
   impedance means connected to the output of said frequency/current converter and having an output tap for developing an output voltage at said output tap having a magnitude which is the square of the magnitude of the input voltage.

9. A squaring circuit according to claim 8, wherein said impedance means comprises an RC network.

10. An $i^2t$ protective circuit for protection of an electrical load from overload, comprising:
   a squaring circuit for supplying an output voltage having an amplitude proportional to the square of the amplitude of an input voltage fed to said squaring circuit, wherein the input voltage is proportional to a current through the load, said squaring circuit including a voltage-controlled oscillator having an input coupled to the input voltage fed to the squaring circuit and an output for producing an output signal having a voltage controlled frequency a frequency/current converter having a first input coupled to the input voltage, a second input connected to the output of said voltage-controlled oscillator, and an output for producing an output current, and impedance means connected to the output of said frequency/current converter and having an output tap for developing an output voltage, at said output tap, having a magnitude which is the square of the magnitude of the input voltage; and, control means connected to said output tap of said impedance means and to the load for interrupting current to the load in dependance of the output voltage at said output tap.

11. An i²t protective circuit according to claim 10, further including:

a measuring resistor connected for receiving the current through the load;

an operational amplifier having an input connected between the load and said measuring resister and having an output for supplying an amplifier signal; and an integrator connected the said operational amplifier for receiving said amplifier signal and connected to said squaring circuit for supplying the proportional input voltage to said squaring circuit;

wherein said control means includes a comparator for receiving said output voltage and comparing said output voltage to a reference voltage for generating a comparator output signal for effecting control of the current to the load.

12. An i₂t protection circuit according to claim 11, wherein said frequency/current converter has a transfer function for producing said output current from said input voltage and said input signal, said function having a set of parameters, wherein said parameters are selected to produce an output current that is low enough to ensure effective control of the current to the load during intermittent operation of the load.

* * * * *